(12) United States Patent
Park

(10) Patent No.: US 10,811,099 B2
(45) Date of Patent: Oct. 20, 2020

(54) SEMICONDUCTOR MEMORY DEVICE AND OPERATING METHOD THEREOF

(71) Applicant: SK hynix Inc., Icheon-si, Gyeonggi-do (KR)

(72) Inventor: Hyun Kyu Park, Cheonan-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 154 days.

(21) Appl. No.: 16/008,449

(22) Filed: Jun. 14, 2018

(65) Prior Publication Data

US 2019/0139609 A1 May 9, 2019

(30) Foreign Application Priority Data

Nov. 3, 2017 (KR) .................. 10-2017-0145939

(51) Int. Cl.
| | |
|---|---|
| *G11C 16/12* | (2006.01) |
| *G11C 16/08* | (2006.01) |
| *G11C 16/30* | (2006.01) |
| *G11C 16/26* | (2006.01) |
| *G11C 16/24* | (2006.01) |
| *G11C 16/34* | (2006.01) |
| *G11C 11/56* | (2006.01) |
| *G11C 16/10* | (2006.01) |
| *G11C 16/04* | (2006.01) |

(52) U.S. Cl.
CPC .......... *G11C 16/12* (2013.01); *G11C 11/5628* (2013.01); *G11C 16/08* (2013.01); *G11C 16/10* (2013.01); *G11C 16/24* (2013.01); *G11C 16/26* (2013.01); *G11C 16/30* (2013.01); *G11C 16/3459* (2013.01); *G11C 16/0466* (2013.01); *G11C 16/0483* (2013.01)

(58) Field of Classification Search
CPC ......... G11C 16/12; G11C 16/08; G11C 16/10; G11C 16/24; G11C 16/26; G11C 16/30; G11C 16/3459; G11C 16/0466; G11C 16/0483; G11C 11/5628
USPC ..................................................... 365/185.23
See application file for complete search history.

(56) References Cited

U.S. PATENT DOCUMENTS

| | | | | |
|---|---|---|---|---|
| 6,072,722 A | * | 6/2000 | Hirano ............... | G11C 16/16 365/185.13 |
| 6,249,458 B1 | * | 6/2001 | Shokouhi ............ | G11C 16/12 326/80 |
| 7,554,860 B1 | * | 6/2009 | Lee .................... | G11C 7/08 365/154 |

(Continued)

FOREIGN PATENT DOCUMENTS

| | | |
|---|---|---|
| KR | 1020080099693 A | 11/2008 |
| KR | 1020090118665 A | 11/2009 |
| KR | 1020100022228 A | 3/2010 |

*Primary Examiner* — Sung Il Cho
(74) *Attorney, Agent, or Firm* — William Park & Associates Ltd.

(57) ABSTRACT

A semiconductor memory device and an operating method thereof may be provided. A semiconductor memory device may include a memory cell array including a plurality of memory cells and a negative voltage switching circuit for receiving and applying a plurality of negative voltages to bit lines of the memory cell array. The negative voltage switching circuit may apply the plurality of negative voltages different from one another to the bit lines in a program operation.

13 Claims, 9 Drawing Sheets

(56) References Cited

U.S. PATENT DOCUMENTS

| | | | | |
|---|---|---|---|---|
| 2006/0083091 | A1* | 4/2006 | Edahiro | H01L 27/115 365/203 |
| 2006/0181926 | A1* | 8/2006 | Ema | G11C 16/3404 365/185.18 |
| 2006/0281260 | A1* | 12/2006 | Lue | H01L 27/11568 438/264 |
| 2007/0258289 | A1* | 11/2007 | Lue | G11C 16/0483 365/185.18 |
| 2008/0025068 | A1* | 1/2008 | Scheuerlein | G11C 17/16 365/148 |
| 2008/0130367 | A1* | 6/2008 | Kang | G11C 16/16 365/185.13 |
| 2008/0279012 | A1* | 11/2008 | Lee | G11C 16/10 365/185.19 |
| 2010/0157688 | A1* | 6/2010 | Issaq | G11C 11/5628 365/185.23 |
| 2014/0043896 | A1* | 2/2014 | Park | G11C 16/3431 365/185.02 |
| 2014/0192584 | A1* | 7/2014 | Aritome | G11O 5/063 365/72 |
| 2019/0035478 | A1* | 1/2019 | Lee | G11C 16/14 |

* cited by examiner

SEMICONDUCTOR MEMORY DEVICE AND OPERATING METHOD THEREOF

CROSS-REFERENCE TO RELATED APPLICATION

The present application claims priority under 35 U.S.C. § 119(a) to Korean patent application 10-2017-0145939 filed on Nov. 3, 2017 in the Korean Intellectual Property Office, the entire disclosure of which is incorporated herein by reference.

BACKGROUND

1. Technical Field

Various embodiments may generally relate to a semiconductor memory device and an operating method thereof, and particularly, to a semiconductor memory device having a plurality of memory cells.

2. Related Art

Recently, as the degree of integration of a flash memory among semiconductor memories increases, the number of memory cells coupled to a word line increases. If the number of memory cells coupled to a word line increases, the length of the word line is lengthened, and hence word line loading increases. In a program operation of memory cells, the magnitude of a program voltage applied to a control gate of a memory cell close to a row decoder, for supplying a word line voltage, is different from that of a program voltage applied to a control gate of a memory cell distant from the row decoder due to the increase in the word line loading. Accordingly, when a program voltage is applied to a word line, a degree to which the threshold voltage of a memory cell close to the row decoder increases is different from that to which the threshold voltage of a memory cell distant from the row decoder increases, and therefore, the threshold voltage distribution of the memory cells is widened. When the program operation is performed by additionally applying a program pulse to the word line so as to increase the threshold voltage of a memory cell distant from the row decoder, the time required to perform the program operation is lengthened, and therefore, programming performance is decreased.

SUMMARY

According to an aspect of the present disclosure, a semiconductor memory device may be provided. The semiconductor memory device may include a memory cell array including a plurality of memory cells and a negative voltage switching circuit configured to receive and apply a plurality of negative voltages to bit lines of the memory cell array. The negative voltage switching circuit may apply the plurality of negative voltages different from one another to the bit lines in a program operation.

According to an aspect of the present disclosure, a semiconductor memory device may be provided. The semiconductor memory device may include a memory cell array including a plurality of memory cells; a voltage generating circuit configured to generate a program voltage, a pass voltage, a plurality of verify voltages, and a plurality of negative voltages for a program operation; a row decoder configured to apply the program voltage, the pass voltage, and the plurality of verify voltages to word lines of the memory cell array; a read/write circuit coupled to bit lines of the memory cell array, the read/write circuit temporarily storing data to be programmed in the program operation and then controlling potential levels of the bit lines according to the temporarily stored data; and a negative voltage switching circuit configured to apply the plurality of negative voltages to the bit lines.

According to an aspect of the present disclosure, a method for operating a semiconductor memory device, which includes a memory cell array including a plurality of memory cells, a row decoder disposed at one side of the memory cell array, and a plurality of word lines coupling the row decoder to the memory cell array, may be provided. The method may include applying a program permission voltage or a program inhibition voltage to a plurality of bit lines coupled to the memory cell array according to data to be programmed; applying a plurality of negative voltages different from one another to selected bit lines of the plurality of bit lines to which the program permission voltage is applied; and applying a program voltage to a selected word line among the plurality of word lines.

DETAILED DESCRIPTION

Figure 1:
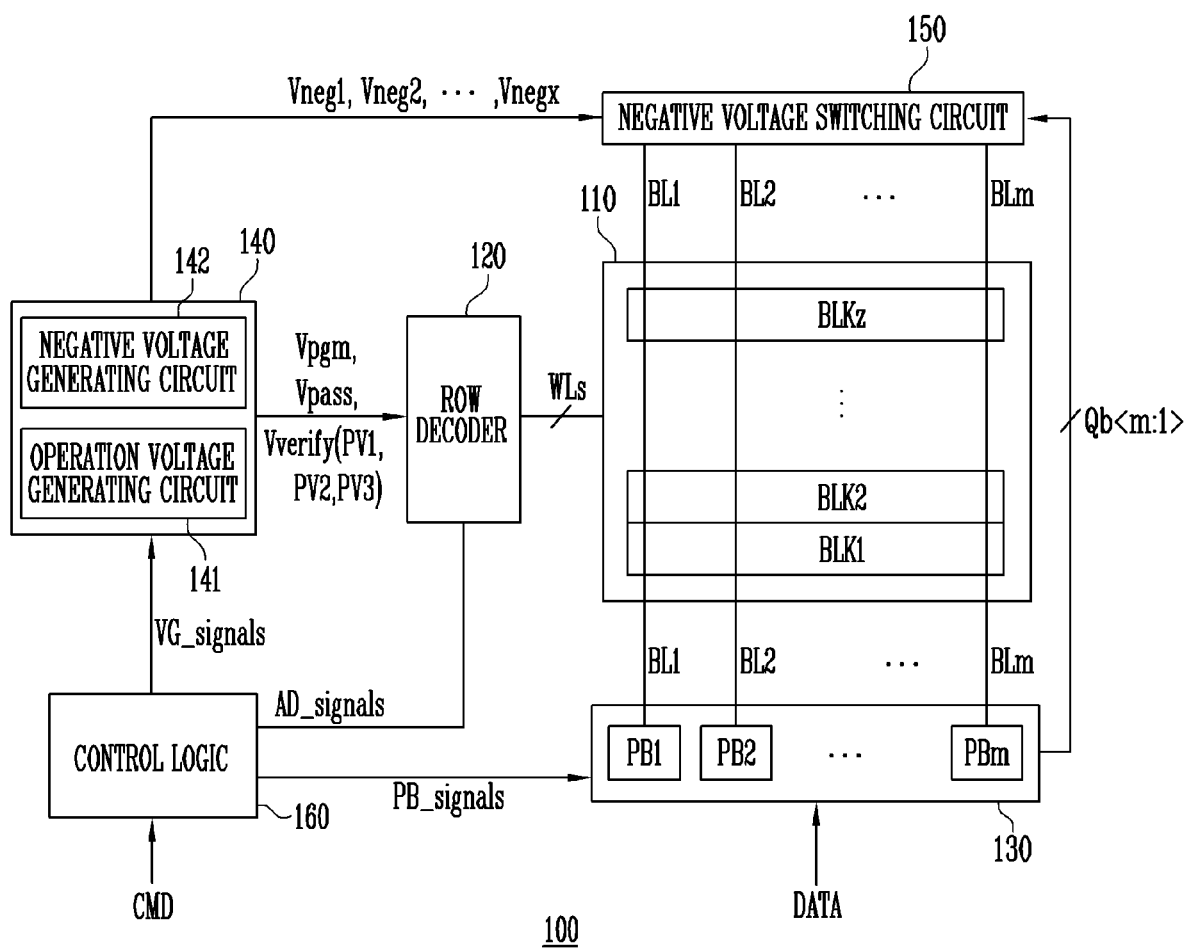
FIG. 1 is a block diagram illustrating a semiconductor memory device according to an embodiment of the present disclosure.

Various embodiments of the present disclosure will be described hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

In the following detailed description, only certain embodiments of the present disclosure have been shown and described, simply by way of illustration. As those skilled in the art would realize, the described embodiments may be modified in various different ways, all without departing from the spirit or scope of the present disclosure. Accordingly, the drawings and description are to be regarded as illustrative in nature and not restrictive.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Embodiments of the present disclosure may provide a semiconductor memory device, in which a voltage applied to a bit line may be controlled according to a distance from a row decoder in a program operation of the semiconductor memory device, and an operating method of the semiconductor memory device.

FIG. 1 is a block diagram illustrating a semiconductor memory device according to an embodiment of the present disclosure.

Referring to FIG. 1, the semiconductor memory device 100 may include a memory cell array 110, a row decoder 120, a read/write circuit 130, a voltage generating circuit 140, a negative voltage switching circuit 150, and a control logic 160.

The row decoder 120, the read/write circuit 130, the voltage generating circuit 140, and the negative voltage switching circuit 150 may be defined as a peripheral circuit for performing a program operation on the memory cell array 110.

The row decoder 120 may be disposed at one side of the memory cell array 110. The memory cell array 110 may include a plurality of memory blocks BLK1 to BLKz. The plurality of memory blocks BLK1 to BLKz may be coupled to the row decoder 120 through word lines WLs. The plurality of memory blocks BLK1 to BLKz may be coupled to the read/write circuit 130 through bit lines BL1 to BLm. The plurality of memory blocks BLK1 to BLKz may include a plurality of memory cells. In an embodiment, the plurality of memory cells may be nonvolatile memory cells based on a charge trap device. A plurality of memory cells commonly coupled to the same word line may be defined as one page. The memory cell array 110 may be configured with a plurality of pages.

The plurality of memory cells included in the memory cell array 110 may have different distances from the row decoder 120 according to arrangement positions thereof, and therefore, the word lines coupling the memory cells to the row decoder 120 may have different lengths. That is, memory cells disposed adjacent to the row decoder 120 may have a short word line length as compared with memory cells disposed distant from the row decoder 120. Accordingly, the plurality of memory cells may correspond to different word line resistance values. Therefore, when a program voltage is applied to a word line in a program operation, the program voltage applied to memory cells disposed adjacent to the row decoder 120 may be higher than that applied to memory cells disposed distant from the row decoder 120.

A detailed configuration of the memory cell array 110 will be described later.

The row decoder 120 may be coupled to the memory cell array 110 through the word lines WLs. The row decoder 120 may be configured to operate in response to control signals AD_signals output from the control logic 160. The row decoder 120 may receive an address through an input/output buffer (not shown) provided in the semiconductor memory device 100. In a program operation, the row decoder 120 may apply a program voltage Vpgm to a selected word line among the word lines WLs according to the received address, and may apply a pass voltage Vpass to unselected word lines. Also, in a program verify operation, the row decoder 120 may apply a plurality of verify voltages Vverify (PV1, PV2, and PV3) to the selected word line, and may apply the pass voltage Vpass to the unselected word lines.

The read/write circuit 130 may include a plurality of page buffers PB1 to PBm. The plurality of page buffers PB1 to PBm may be coupled to the memory cell array 110 through the bit lines BL1 to BLm. In the program operation, the plurality of page buffers PB1 to PBm may temporarily store data DATA to be programmed and may control potential levels of corresponding bit lines BL1 to BLm according to the temporarily stored data DATA. Also, in the program verify operation, the plurality of page buffers PB1 to PBm may precharge the potential levels of the corresponding bit lines BL1 to BLm to certain levels, sense potential levels or current amounts of the corresponding bit lines BL1 to BLm, and then compare the sensed potential levels or current amounts with the temporarily stored data DATA, thereby determining whether the program operation has passed or failed.

The read/write circuit 130 may operate in response to the control signals PB_signals output from the control logic 160. Also, in a blind program operation during the program operation, the read/write circuit 130 may output, to the negative voltage switching circuit 150, data temporarily stored in the plurality of page buffers PB1 to PBm or latch signals Qb<m:1> according to a verify result. In the blind program operation, it may be difficult for threshold voltages of cells in an erase state to be rapidly increased at the early stage of the program operation. Hence, the program verify operation using a high-level verify voltage may be omitted, and only the program verify operation using a low-level verify voltage may be performed. Thus, the number of times of performing the program verify operation may be decreased, and accordingly, the time required to perform the program operation may be reduced.

The voltage generating circuit 140 may be configured to include an operation voltage generating circuit 141 and a negative voltage generating circuit 142.

The operation voltage generating circuit 141 may generate and output the program voltage Vpgm and the pass voltage Vpass in the program operation, and the operation voltage generating circuit 141 may generate and output the plurality of verify voltages Vverify (PV1, PV2, and PV3) in the program verify operation. The voltage generating circuit 140 may operate in response to control signals VG_signals output from the control logic 160.

The negative generating circuit 142 may generate and output a plurality of negative voltages Vneg1, Vneg2, . . . , and Vnegx in the blind program operation during the program operation.

In the program operation, the negative voltage switching circuit 150 may apply the plurality of negative voltages Vneg1, Vneg2, . . . , and Vnegx output from the negative voltage generating circuit 142 to the plurality of bit lines BL1 to BLm in response to the latch signals Qb<m:1> output from the read/write circuit 130. For example, in the blind program operation during the program operation, the negative voltage switching circuit 150 may apply the plurality of negative voltages Vneg1, Vneg2, . . . , and Vnegx to bit lines coupled to cells to be programmed among the plurality of bit lines BL1 to BLm. In this case, the negative voltage switching circuit 150 may apply a negative voltage having a relatively high potential level to a bit line coupled to cells to be programmed, which are disposed adjacent to the row decoder 120, among the plurality of bit lines BL1 to BLm; and the negative voltage switching circuit 150 may apply a negative voltage having a relatively low potential level to a bit line coupled to cells to be programmed, which are disposed distant from the row decoder 120, among the plurality of bit lines BL1 to BLm. Also, the negative voltage switching circuit 150 may group the plurality of bit lines BL1 to BLm into at least two bit line groups and may perform switching such that negative voltages applied to the groups are different from each other. Each bit line group may include at least one bit line, and the bit lines included in each bit line group may be bit lines adjacent to each other.

The control logic 160 may be coupled to the row decoder 120, the read/write circuit 130, the voltage generating circuit 140, and the negative voltage switching circuit 150. The control logic 160 may receive a command CMD through the input/output buffer (not shown) of the semiconductor memory device 100. The control logic 160 may control the row decoder 120, the read/write circuit 130, and the voltage generating circuit 140 to perform the program operation of the semiconductor memory device 100 in response to the command CMD. The control logic 160 may be implemented with hardware or software or any combination thereof.

Figure 2:
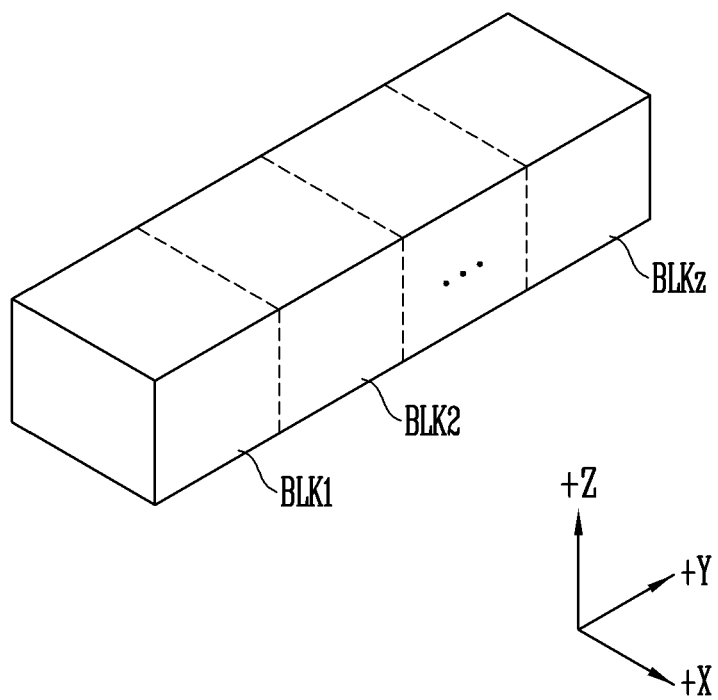
FIG. 2 is a block diagram illustrating an embodiment of a memory cell array of FIG. 1.

FIG. 2 is a block diagram illustrating an embodiment of the memory cell array 110 of FIG. 1.

Referring to FIG. 2, the memory cell array 110 may include a plurality of memory blocks BLK1 to BLKz. Each memory block may have a three-dimensional structure. Each memory block may include a plurality of memory cells stacked above a substrate. The plurality of memory cells may be arranged along +X, +Y, and +Z directions. The structure of each memory block will be described in more detail with reference to FIG. 3.

Figure 3:
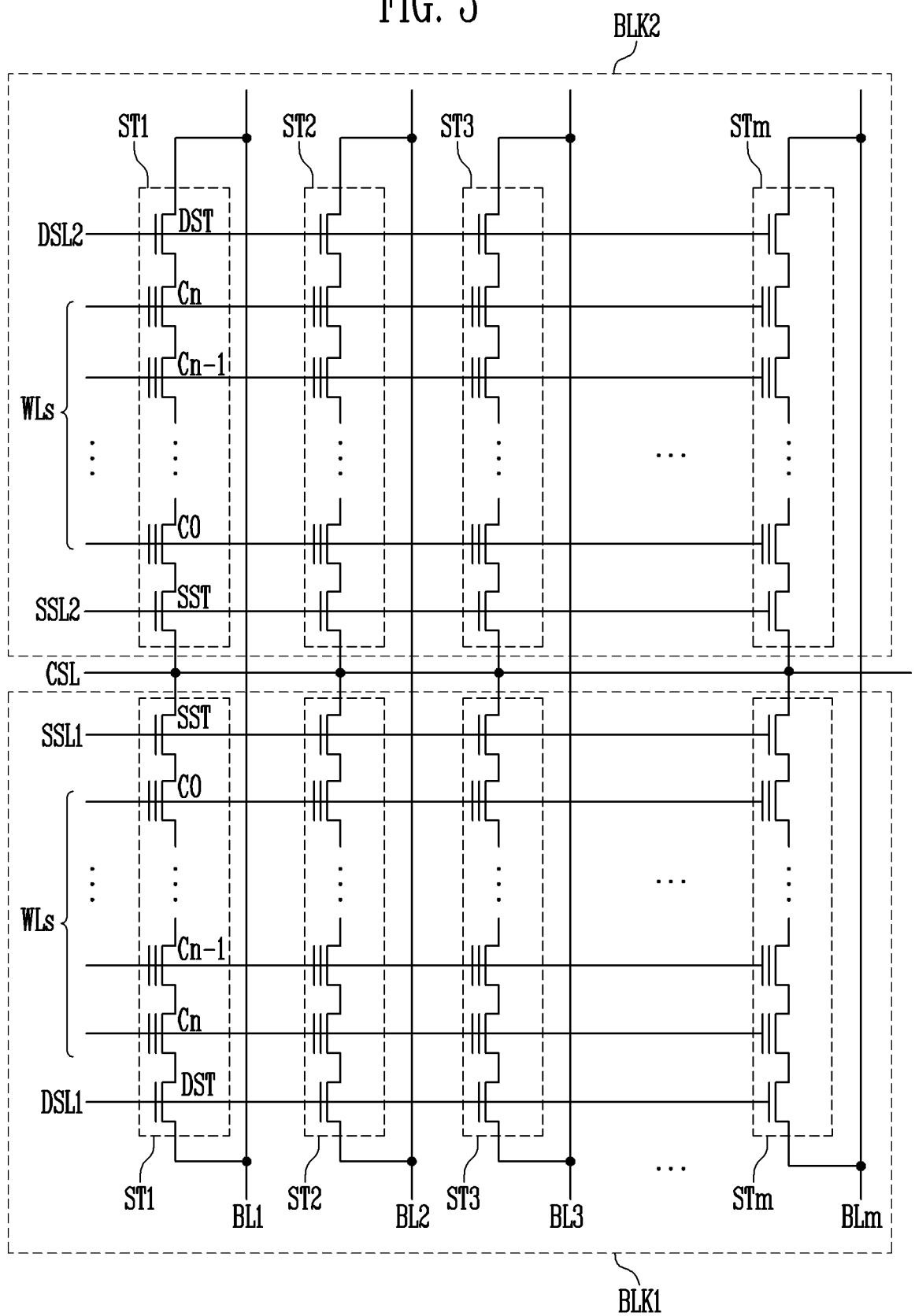
FIG. 3 is a circuit diagram illustrating a detailed configuration of memory blocks of FIG. 1.

FIG. 3 is a circuit diagram illustrating the memory blocks of FIG. 1.

In FIG. 1, it is illustrated that the plurality of memory blocks BLK1 to BLKz may be coupled to the read/write circuit 130 through the bit lines BL1 to BLm. However, for convenience of description, a memory block BLK1 and a memory block BLK2 are illustrated in FIG. 3. The memory block BLK1 and the memory block BLK2 may have structures sharing bit lines BL1 to BLm and a common source line CSL.

Referring to FIG. 3, the memory block BLK1 and the memory block BLK2 may be coupled to a plurality of bit lines BL1 to BLm.

The memory block BLK1 may include a plurality of cell strings ST1 to STm. The plurality of cell strings ST1 to STm may be coupled between the plurality of bit lines BL1 to BLm and the common source line CSL, respectively. Each of the plurality of cell strings ST1 to STm may include a source select transistor SST, a plurality of memory cells C0 to Cn coupled in series, and a drain select transistor DST. The source select transistor SST may be coupled to a source select line SSL1. The plurality of memory cells C0 to Cn may be coupled to word lines WLs, respectively. The drain select transistor DST may be coupled to a drain select line DSL1. The common source line CSL may be coupled to a source of the source select transistor SST. Each of the bit lines BL1 to BLm may be coupled to a drain of a corresponding drain select transistor DST.

The memory block BLK2 may be configured in a structure similar to that of the memory block BLK1. That is, the memory block BLK2 may include a plurality of cell strings ST1 to STm, and the plurality of cell strings ST1 to STm may be coupled between the plurality of bit lines BL1 to BLm and the common source line CSL, respectively. Each of the plurality of cell strings ST1 to STm may include a source select transistor SST, a plurality of memory cells C0 to Cn coupled in series, and a drain select transistor DST. The source select transistor SST may be coupled to a source select line SSL2. The plurality of memory cells C0 to Cn may be coupled to word lines WLs, respectively. The drain select transistor DST may be coupled to a drain select line DSL2. The common source line CSL may be coupled to a source of the source select transistor SST. Each of the bit lines BL1 to BLM may be coupled to a drain of a corresponding drain select transistor DST.

As described above, the memory block BLK1 and the memory block BLK2 may be configured with structures similar to each other. The memory block BLK1 and the memory block BLK2 may be designed to have structures in which the drain select lines (DSL1, DSL2) and the source select lines (SSL1, SSL2) are electrically isolated from each other.

In an embodiment of the present disclosure, the cell string ST1 among the plurality of cell strings ST1 to STm may be defined as a cell string disposed most adjacent to the row decoder 120 of FIG. 1, and the cell string STm among the plurality of cell strings ST1 to STm may be defined as a cell string disposed most distant from the row decoder 120.

Figure 4:
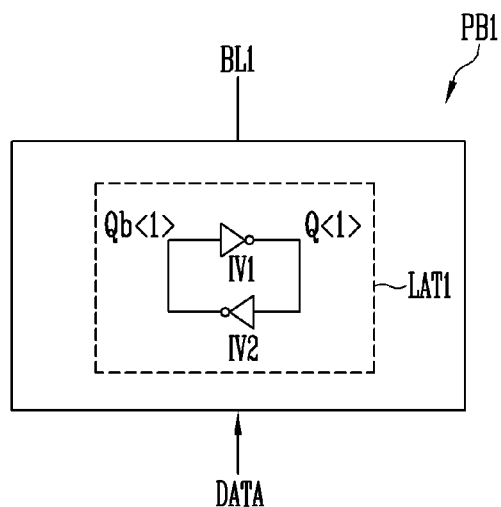
FIG. 4 is a diagram illustrating a page buffer of FIG. 1.

FIG. 4 is a diagram illustrating a page buffer of FIG. 1.

Referring to FIG. 4, the page buffer PB1 may be configured to include a latch LAT1 capable of storing data DATA. The latch LAT1 may be configured to include inverters IV1 and IV2 coupled in inverse parallel between a first node Q<1> and a second node Qb<1>.

The latch LAT1 may temporarily store data DATA input in a program operation. For example, when the input data DATA has a data value (e.g., "0") corresponding to a program cell, the latch LAT1 may be controlled such that the first node Q<1> has a logic low level and the second node Qb<1> has a logic high level. In addition, when the input data DATA has a data value (e.g., "1") corresponding to an erase cell, the latch LAT1 may be controlled such that the first node Q<1> has the logic high level and the second node Qb<1> has the logic low level.

Also, in a program voltage applying operation during the program operation, the latch LAT1 may control a potential level of a corresponding bit line BL1 according to the temporarily stored data DATA. For example, when the input data DATA has a data value (e.g., "0") corresponding to a program cell, the latch LAT1 may control a program permission voltage (e.g., a ground voltage) to be applied to the corresponding bit line BL1. In addition, when the input data DATA has a data value (e.g., "1") corresponding to an erase cell, the latch LAT1 may control a program inhibition voltage (e.g., a power voltage) to be applied to the corresponding bit line BL1.

Also, in a program verify operation, the latch LAT1 may store verify data corresponding to a verify result, based on the potential level of the corresponding bit line BL1 and the value of the temporarily stored data DATA.

For example, when the temporarily stored data has a data value (e.g., "0") corresponding to a program cell, and it is determined in the verify operation that a selected memory cell coupled to the corresponding bit line has been completely programmed, the latch LAT1 may be controlled such that the first node Q<1> has the logic high level and the second node Qb<1> has the logic low level.

In addition, when the temporarily stored data has a data value (e.g., "0") corresponding to a program cell, and it is determined in the verify operation that a selected memory cell coupled to the corresponding bit line has not been programmed, the latch LAT1 may be controlled such that the first node Q<1> has the logic low level and the second node Qb<1> has the logic high level.

The latch LAT1 may control the program permission voltage or the program inhibition voltage to be applied to the corresponding bit line BL1, based on a verify data value stored as a result of the verify operation.

The latch LAT1 may use a potential level of the second node Qb<1>, which corresponds to the temporarily stored data or the verify data value obtained as the verify result, as a latch signal, and may output the latch signal to the negative voltage switching circuit 150 of FIG. 1.

Figure 5:
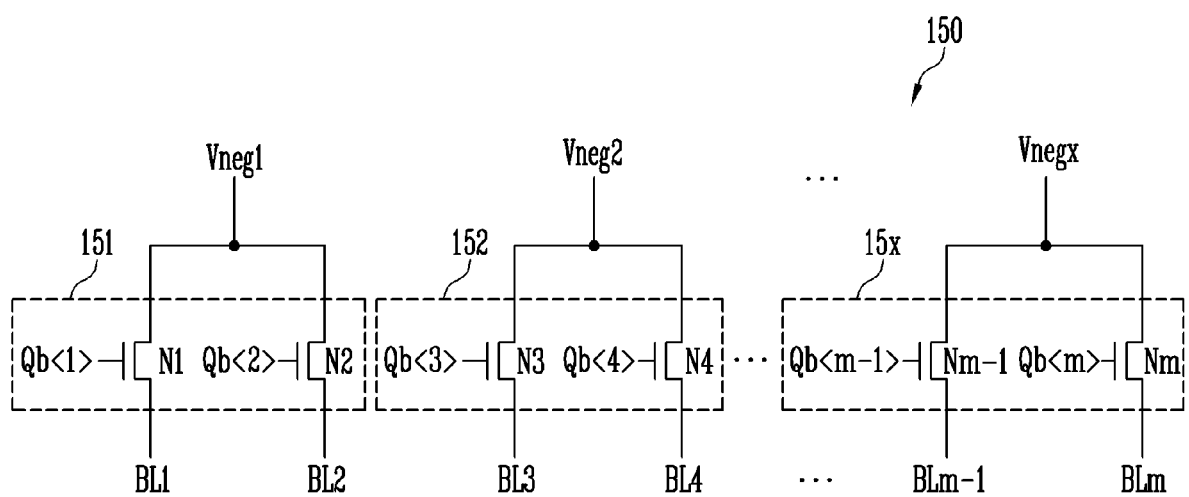
FIG. 5 is a diagram illustrating a negative voltage switching circuit of FIG. 1.

FIG. 5 is a diagram illustrating the negative voltage switching circuit 150 of FIG. 1.

The negative voltage switching circuit 150 may be configured to include a plurality of switching units 151 to 15x.

For example, a first switching unit 151 may correspond to a first bit line group BL1 and BL2. The first switching unit 151 may apply or interrupt a first negative voltage Vneg1 to the first bit line group BL1 and BL2 in response to latch signals Qb<1> and Qb<2>. The first switching unit 151 may include first and second NMOS transistors N1 and N2. The first NMOS transistor N1 may apply the first negative voltage Vneg1 to a bit line BL1 in response to the latch signal Qb<1>, and the second NMOS transistor N2 may apply the first negative voltage Vneg1 to a bit line BL2 in response to the latch signal Qb<2>.

A second switching unit 152 may correspond to a second bit line group BL3 and BL4. The second switching unit 152 may apply or interrupt a second negative voltage Vneg2 to the second bit line group BL3 and BL4 in response to latch signals Qb<3> and Qb<4>, The second switching unit 152 may include third and fourth NMOS transistors N3 and N4. The third NMOS transistor N3 may apply the second negative voltage Vneg2 to a bit line BL3 in response to the latch signal Qb<3>, and the fourth NMOS transistor N4 may apply the second negative voltage Vneg2 to a bit line BL4 in response to the latch signal Qb<4>.

An xth switching unit 15x may correspond to an xth bit line group BLm−1 and BLm. The xth switching unit 15x may apply or interrupt an xth negative voltage Vnegx to the xth bit line group BLm−1 and BLm in response to latch signals Qb<m−1> and Qb<m>. The xth switching unit 15x may include (m−1)th and mth NMOS transistors Nm−1 and Nm. The (m−1)th NMOS transistor Nm−1 may apply the xth negative voltage Vnegx to a bit line BLm−1 in response to the latch signal Qb<m−1>, and the mth NMOS transistor Nm may apply the xth negative voltage Vnegx to a bit line BLm in response to the latch signal Qb<m>.

The plurality of negative voltages Vneg1 to Vnegx described above may have potential levels different from one another. For example, the first negative voltage Vneg1 may have the highest potential level, and the xth negative voltage Vnegx may have the lowest potential level. Each of the plurality of negative voltages Vneg1 to Vnegx may be set to have a lower potential level as a corresponding bit line group becomes more distant from the row decoder 120 of FIG. 1.

As described above, in an embodiment of the present disclosure, it is illustrated that two bit lines may be included in one bit line group. However, the present disclosure is not limited thereto, and at least one bit line may be included in one bit line group.

Also, in an embodiment of the present disclosure, it is illustrated that the first negative voltage Vneg1 may be applied to the first bit line group. However, a ground voltage may be applied to the first bit line group, and the first negative voltage Vneg1 lower than the ground voltage may be applied to the second bit line group.

Figure 6:
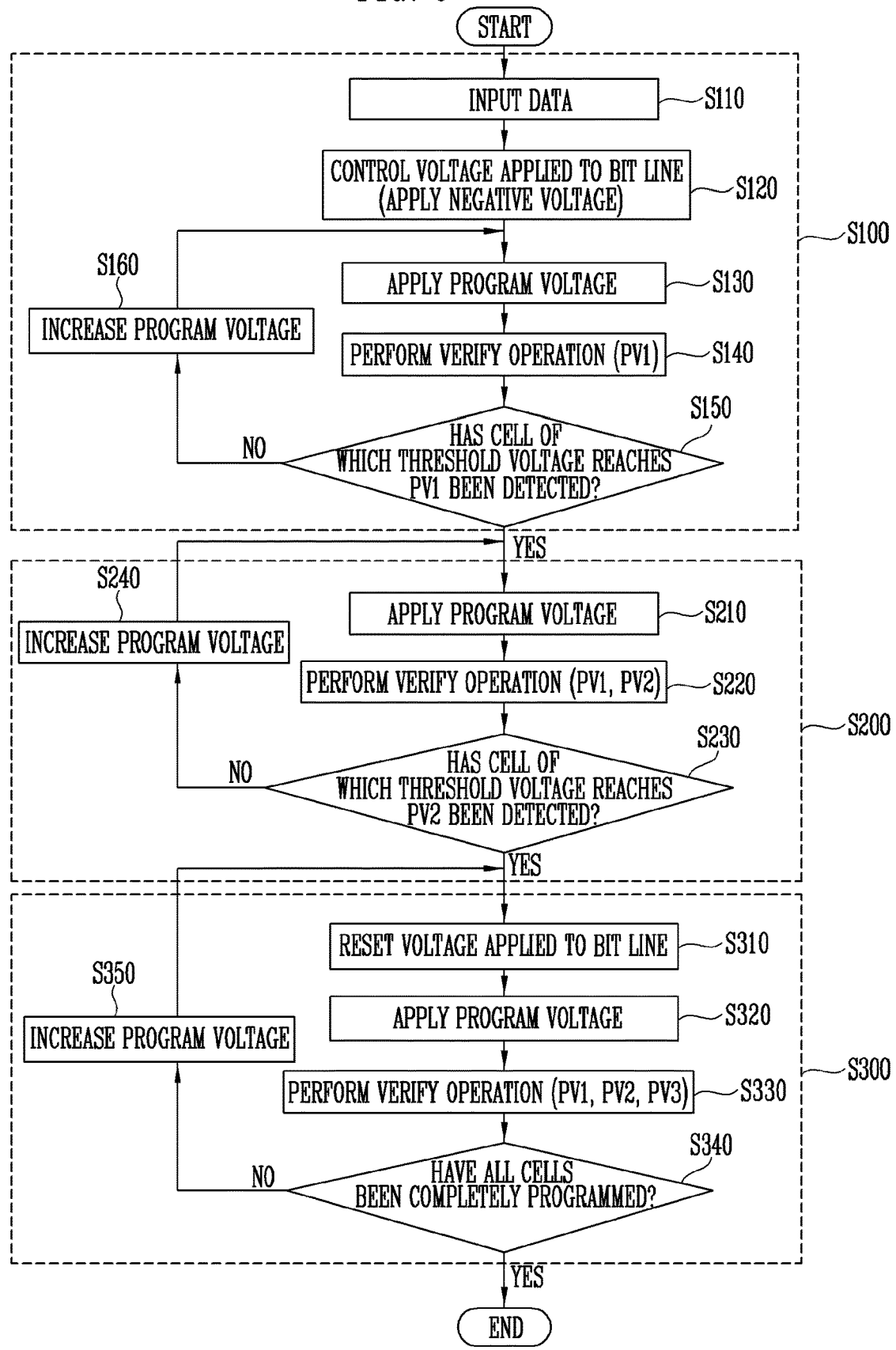
FIG. 6 is a flowchart illustrating an operation of the semiconductor memory device according to an embodiment of the present disclosure.

FIG. 6 is a flowchart illustrating an operation of the semiconductor memory device according to an embodiment of the present disclosure.

Figure 7:
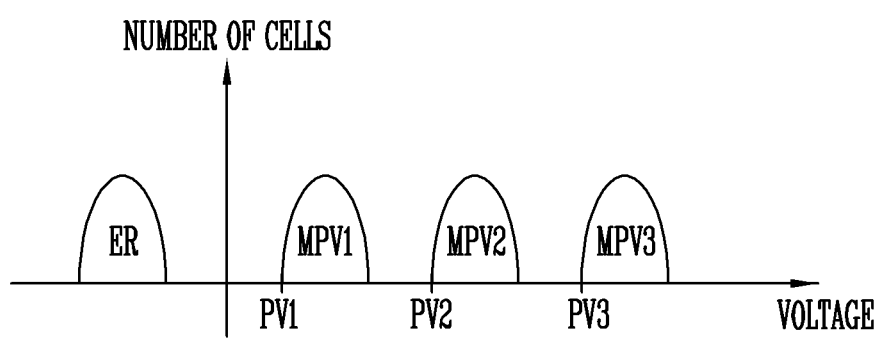
FIG. 7 is a threshold voltage distribution diagram illustrating an operation of the semiconductor memory device according to an embodiment of the present disclosure.

FIG. 7 is a threshold voltage distribution diagram illustrating an operation of the semiconductor memory device according to an embodiment of the present disclosure. In FIG. 7, a threshold voltage distribution diagram of an erase state ER and a plurality of program states MPV1, MPV2, and MPV3 and verify voltages PV1, PV2, and PV3 for verifying the states.

Figure 8:
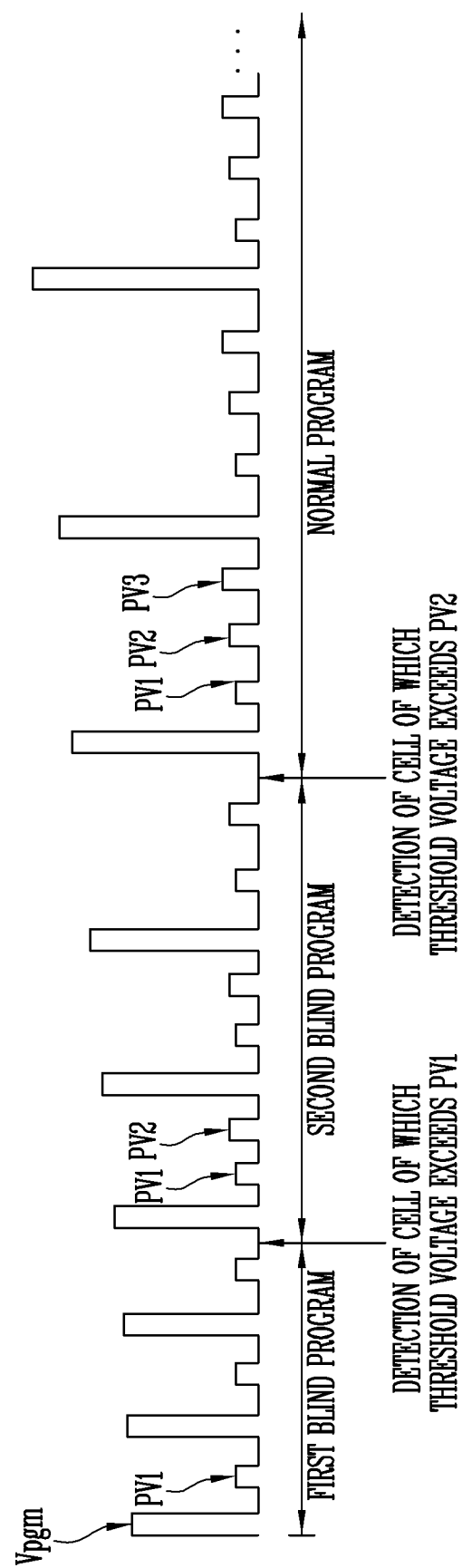
FIG. 8 is a waveform diagram of a program voltage and verify voltages, illustrating the operation of the semiconductor memory device according to an embodiment of the present disclosure.

FIG. 8 is a waveform diagram of a program voltage and verify voltages, illustrating the operation of the semiconductor memory device according to an embodiment of the present disclosure. In FIG. 8, a program operation that may include operations such as a first blind program, a second blind program, and a normal program with a program voltage Vpgm and verify voltages PV1, PV2, and PV3 is illustrated.

The operation of the semiconductor memory device according to an embodiment of the present disclosure will be as follows with reference to FIGS. 1 to 8.

A program operation of the semiconductor memory device 100 may include a blind program operation including a first blind program operation (S100) and a second blind program operation (S200), and a normal program operation (S300).

In the program operation of the semiconductor memory device 100, data DATA to be programmed may be input to be stored in the plurality of page buffers PB1 to PBm included in the read/write circuit 130 (S110). The plurality of page buffers PB1 to PBm may control potential levels of corresponding bit lines BL1 to BLm according to arbitrarily stored data DATA. That is, the plurality of page buffers PB1 to PBm may apply a program permission voltage or a program inhibition voltage to the corresponding bit lines BL1 to BLm according to the arbitrarily stored data DATA. For example, in an embodiment, the program permission voltage may be applied to bit lines coupled to memory cells to be programmed.

The negative voltage generating circuit 142 of the voltage generating circuit 140 may generate and output a plurality of negative voltages Vneg1, Vneg2, and Vnegx in response to control signals VG_signals output from the control logic 160. At this time, the plurality of negative voltages Vneg1, Vneg2, . . . , and Vnegx may have potential levels different from one another. For example, a first negative voltage Vneg1 may be a negative voltage having the highest potential, and an xth negative voltage Vnegx may be a negative voltage having the lowest potential.

The negative switching circuit 150 may apply the plurality of negative voltages Vneg1, Vneg2, . . . , and Vnegx, output from the negative voltage generating circuit 142, to the plurality of bit lines BL1 to BLm in response to the latch signals Qb<m:1> output from the read/write circuit 130 (S120). For example, in the blind program operation during the program operation, the negative voltage switching circuit 150 may apply the plurality of negative voltages Vneg1, Vneg2, . . . , and Vnegx to bit lines coupled to cells to be programmed among the plurality of bit lines BL1 to BLm. In this case, the negative voltage switching circuit 150 may apply a negative voltage having a relatively high potential level to a bit line coupled to cells to be programmed, which are disposed adjacent to the row decoder 120, among the plurality of bit lines BL1 to BLm; and the negative voltage switching circuit 150 may apply a negative voltage having a relatively low potential level to a bit line coupled to cells to be programmed, which are disposed distant from the row decoder 120, among the plurality of bit lines BL1 to BLm. At this time, the plurality of bit lines BL1 to BLm may be divided into a plurality of bit line groups such that the same negative voltage is applied to at least one bit line included in one bit line group. If a negative voltage is applied to the bit lines coupled to the cells to be programmed as described above, a potential difference between a program voltage applied to the cell to be programmed and a lower channel of the cell to be programmed may be further increased, and thus the speed of the program operation may be enhanced.

The operation voltage generating circuit 141 of the voltage generating circuit 140 may generate a program voltage Vpgm and a pass voltage Vpass in response to control signals VG_signals output from the control logic 160. The row decoder 120 may apply the program voltage Vpgm to a selected word line among the word lines WLs and may apply the pass voltage Vpass to unselected word lines among the word line WLs, in response to control signals AD_signals and an address ADDR, which are output from the control logic 160 (S130).

After this, a verify operation using a first verify voltage PV1 may be performed (S140). In a verify operation, the operation voltage generating circuit 141 of the voltage generating circuit 140 may generate and output the first verify voltage PV1, among the plurality of verify voltages, for verifying the lowest program state MPV1. The row decoder 120 may apply the first verify voltage PV1 to the selected word line among the word lines WLs and may apply the pass voltage Vpass to the unselected word lines among the word lines WLs in response to the control signal AD_signals and the address ADDR, which are output from the control logic 160. After this, the read/write circuit 130 may sense potential levels or current amounts of the plurality of bit lines BL1 to BLm and may store verify data corresponding to a verify result obtained by comparing the sensed potential levels or current amounts with the temporarily stored data DATA. The read/write circuit 130 may determine whether the program operation has passed or failed.

As a result of the verify operation, the read/write circuit 130 may determine whether at least one memory cell, among the plurality of memory cells, of which threshold voltage is higher than the first verify voltage PV1 has been detected (S150) [e.g., in an embodiment, when detection of cell of which threshold voltage exceeds PV1 occurs, as illustrated in FIG. 8]. That is, the read/write circuit 130 may determine whether the program operation of at least one memory cell has passed.

As the determined result, when it is determined that there is no memory cell of which program operation has passed (NO), the program voltage Vpgm may be increased by a step voltage (S160), and the first blind program operation may be re-performed from the step (S130) of applying the program voltage.

As the determined result, when at least one memory cell of which program operation has passed is detected (YES), the second blind program operation may be performed (S200).

At this time, a corresponding page buffer may apply the program inhibition voltage to a bit line coupled to the memory cell of which program operation has passed, and the negative voltage switching circuit 150 may interrupt the negative voltage that has been applied to the bit line coupled to the memory cell of which program operation has passed.

The operation voltage generation circuit 141 of the voltage generating circuit 140 may generate a program voltage Vpgm and a pass voltage Vpass in response to control signals VG_signals output from the control logic 160. The row decoder 120 may apply the program voltage Vpgm to a selected word line among the word lines WLs and may apply the pass voltage Vpass to unselected word lines among the word line WLs in response to control signals AD_signals and an address ADDR, which are output from the control logic 160 (S210).

After this, a verify operation using the first verify voltage PV1 and a second verify voltage PV2 may be performed (S220). In the verify operation, a verify operation using the first verify voltage PV1 may be performed, and a verify operation using the second verify voltage PV2 may be performed.

The verify operation using the first verify voltage PV1 may be similar to that described in the step S140, and therefore, its detailed description will be omitted.

After the verify operation using the first verify voltage PV1, the operation voltage generating circuit 141 of the voltage generation circuit 140 may generate and output the second verify voltage PV2, among the plurality of verify voltages, for verifying a program state MPV2. The row decoder 120 may apply the second verify voltage PV2 to the selected word line among the word lines WLs and may apply the pass voltage Vpass to the unselected word lines among the word lines WLs in response to control signals AD_signals and an address ADDR, which are output from the control logic 160. After this, the read/write circuit 130 may sense potential levels or current amounts of the plurality of bit lines BL1 to BLm and may store verify data corresponding to a verify result obtained by comparing the sensed potential levels or current amounts with the temporarily stored data DATA. The read/write circuit 130 may determine whether the program operation has passed or failed.

As a result of the verify operation, the read/write circuit 130 may determine whether at least one memory cell, among the plurality of memory cells, of which threshold voltage is higher than the second verify voltage PV2 has been detected (S230) [e.g., in an embodiment, when detection of cell of which threshold voltage exceeds PV2 occurs, as illustrated in FIG. 8]. That is, the read/write circuit 130 may determine whether the program operation of at least one memory cell has passed in the second program state MPV2.

As the determined result, when it is determined that there is no memory cell of which program operation has passed in the second program state MPV2 (NO), the program voltage Vpgm may be increased by a step voltage (S240), and the second blind program operation may be re-performed from the step (S210) of applying the program voltage.

As the determined result, when at least one memory cell of which program operation has passed in the second program state MPV2 is detected (YES), the normal program operation may be performed (S300).

At this time, a corresponding page buffer may apply the program inhibition voltage to a bit line coupled to the memory cell of which program operation has passed in a first program state MPV1 or the second program state MPV2, and the negative voltage generating circuit 142 and the negative switching circuit 150 may be non-activated in the normal program operation. A reset voltage, for resetting the increased voltage of a bit line, may be applied to a bit line coupled to memory cells to be programmed (S310), in the normal program operation.

The operation voltage generating circuit 141 of the voltage generating circuit 140 may generate a program voltage Vpgm and a pass voltage Vpass in response to control signals VG_signals output from the control logic 160. The row decoder 120 may apply the program voltage Vpgm to a selected word line among the word lines WLs and may apply the pass voltage Vpass to unselected word lines among the word lines WLs in response to control signals AD_signals and an address ADDR, which are output from the control logic 160 (S320).

After this, a verify operation using the first verify voltage PV1, the second verify voltage PV2, and a third verify voltage PV3 may be performed (S330). In the verify operation, a verify operation using the first verify voltage PV1 may be performed, a verify operation using the second verify voltage PV2 may be performed, and a verify operation using the third verify voltage PV3 may then be performed.

The verify operation using the first verify voltage PV1 and the verify operation using the second verify voltage PV2 may be similar to those described in the steps S140 and S220, and therefore, their detailed descriptions will be omitted.

After the verify operation using the second verify voltage PV2, the operation voltage generating circuit 141 of the voltage generating circuit 140 may generate and output the third verify voltage PV3, among the plurality of verify voltages, for verifying a program state MPV3. The row decoder 120 may apply the third verify voltage PV3 to the selected word line among the word lines WLs and may apply the pass voltage Vpass to the unselected word lines among the word lines WLs in response to control signals AD_signals and an address ADDR, which are output from the control logic 160. After this, the read/write circuit 130 may sense potential levels or current amounts of the plurality of bit lines BL1 to BLm and may store verify data corresponding to a verify result obtained by comparing the sensed potential levels or current amounts with the temporarily stored data DATA. The read/write circuit 130 may determine whether the program operation has passed or failed.

As a result of the verify operation, the read/write circuit 130 may determine whether the plurality of memory cells have all been completely programmed (S340). When it is determined that the plurality of memory cells have all been completely programmed (YES), the program operation may be ended. When it is determined that some memory cells have not been completely programmed (N), the program voltage may be increased by a step voltage (S350), and the normal program operation may be re-performed from the step (S310) of resetting the voltage applied to the bit line.

As described above, according to an embodiment of the present disclosure, a negative voltage may be applied to bit lines in the blind program operation, of skipping some verify operations, during the program operation, so that the speed of the program operation may be improved. Further, in the blind program operation, different negative voltages may be applied to the bit lines according to distances from the row decoder 120, so that it may be possible to compensate for the unequally applied program voltage Vpgm due to word line loading.

In an embodiment of the present disclosure, it is illustrated that a negative voltage may be applied to bit lines in the blind program operation. However, the present disclosure is not limited thereto, and the negative voltage may also be applied to bit lines in the normal program operation. A lower negative voltage may be applied as memory cells become more distant from the row decoder.

Figure 9:
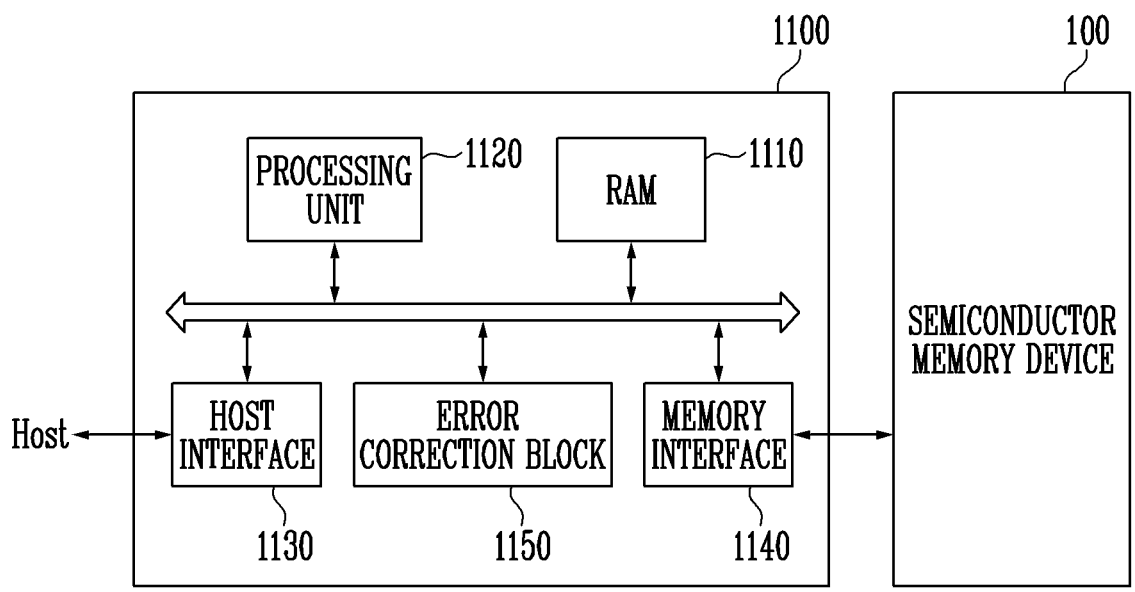
FIG. 9 is a block diagram illustrating a memory system including the semiconductor memory device of FIG. 1.

FIG. 9 is a block diagram illustrating a memory system including the semiconductor memory device of FIG. 1.

Referring to FIG. 9, the memory system 1000 may include a semiconductor memory device 100 and the controller 1100.

The semiconductor memory device 100 may be configured and operated identically to the semiconductor memory device described with reference to FIG. 1. Hereinafter, overlapping descriptions will be omitted.

The controller 1100 may be coupled to a host Host and the semiconductor memory device 100. The controller 1100 may be configured to access the semiconductor memory device 100 in response to a request from the host Host. For example, the controller 1100 may be configured to control read, write, erase, and background operations of the semiconductor memory device 100. The controller 1100 may be configured to provide an interface between the semiconductor memory device 100 and the host Host. The controller 1100 may be configured to drive firmware for controlling the semiconductor memory device 100.

The controller 1100 may include a random access memory (RAM) 1110, a processing unit 1120, a host interface 1130, a memory interface 1140, and an error correction block 1150. The RAM 1110 may be used as at least one of an operation memory of the processing unit 1120, a cache memory between the semiconductor memory device 100 and the host Host, and a buffer memory between the semiconductor memory device 100 and the host Host. The processing unit 1120 may control overall operations of the controller 1100. In addition, the controller 1100 may temporarily store program data provided from the host Host in a write operation.

The host interface 1130 may include a protocol for exchanging data between the host Host and the controller 1100. In an embodiment, the controller 1100 may be configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The memory interface 1140 may interface with the semiconductor memory device 100. For example, the memory interface 1140 may include a NAND interface or a NOR interface.

The error correction block 1150 may be configured to detect and correct an error for data received from the semiconductor memory device 100 by using an error correction code (ECC). The processing unit 1120 may control the semiconductor memory device 100 to adjust a read voltage, based on an error detection result of the error correction block 1150, and to perform re-reading. In an embodiment, the error correction block 1150 may be provided as a component of the controller 1100.

The controller 1100 and the semiconductor memory device 100 may be integrated into one semiconductor device. In an embodiment, the controller 1100 and the semiconductor memory device 100 may be integrated into one semiconductor device, to constitute a memory card. For example, the controller 1100 and the semiconductor memory device 100 may be integrated into one semiconductor device, to constitute a memory card such as a PC card (personal computer memory card international association (PCMCIA)), a compact flash (CF) card, a smart media card (SM or SMC), a memory stick, a multimedia card (MMC, RS-MMC, or MMCmicro), an SD card (SD, miniSD, microSD, or SDHC), or a universal flash storage (UFS).

The controller 1100 and the semiconductor memory device 100 may be integrated into one semiconductor device to constitute a semiconductor drive (solid state drive (SSD)). The semiconductor drive SSD may include a storage device configured to store data in a semiconductor memory. If the memory system 1000 is implemented as a semiconductor drive SSD, the operating speed of the host Host coupled to the memory system 1000 may be remarkably improved.

As another example, the memory system 1000 may be provided as one of various components of an electronic device such as a computer, a ultra mobile PC (UMPC), a workstation, a net-book, a personal digital assistant (PDA), a portable computer, a web tablet, a wireless phone, a mobile phone, a smart phone, an e-book, a portable multimedia player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an embodiment, the semiconductor memory device 100 or the memory system 1000 may be packaged in various forms. For example, the semiconductor memory device 100 or the memory system 1000 may be packaged in a manner such as package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small out line package (SSOP), thin small outline package (TSOP), thin quad flat pack (TQFP), system in package (SIP), multi chip package (MCP), wafer-level fabricated package (WFP), or wafer-level processed stack package (WSP).

Figure 10:
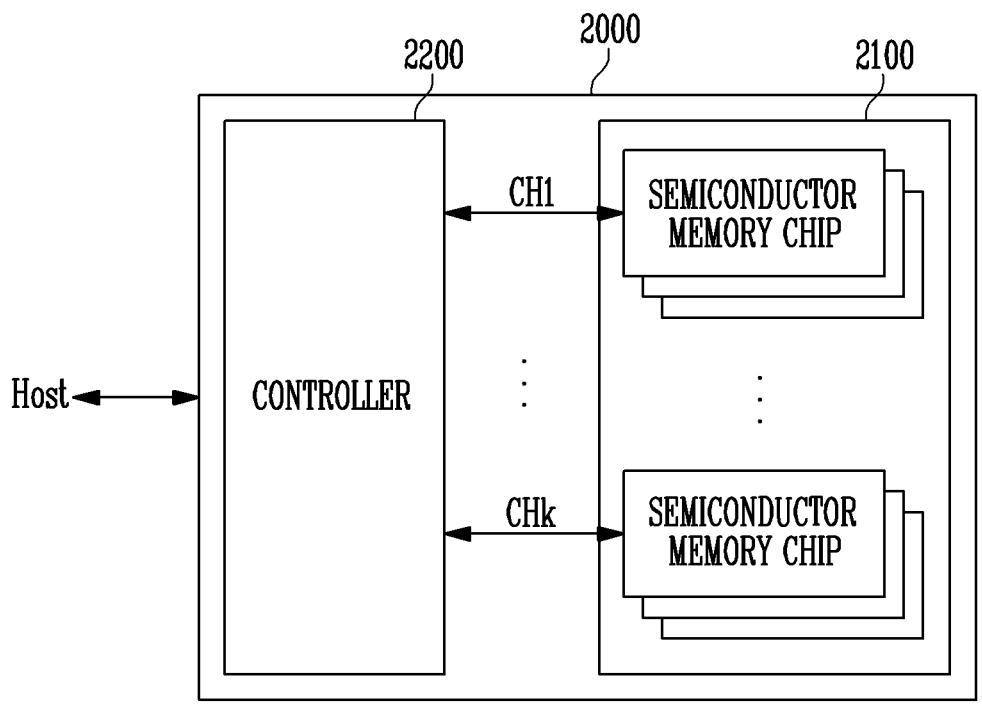
FIG. 10 is a block diagram illustrating an application example of the memory system of FIG. 9.

FIG. 10 is a block diagram illustrating an application example of the memory system of FIG. 9.

Referring to FIG. 10, the memory system 2000 may include a semiconductor memory device 2100 and a controller 2200. The semiconductor memory device 2100 may include a plurality of semiconductor memory chips. The plurality of semiconductor memory chips may be divided into a plurality of groups.

In FIG. 10, it is illustrated that the plurality of groups may communicate with the controller 2200 through first to kth channels CH1 to CHk. Each semiconductor memory chip may be configured and operated in the same manner as the semiconductor memory device 100 described with reference to FIG. 1.

Each group may be configured to communicate with the controller 2200 through one common channel. The controller 2200 may be configured similarly to the controller 1100 described with reference to FIG. 9. The controller 2200 may be configured to control the plurality of memory chips of the semiconductor memory device 2100 through the plurality of channels CH1 to CHk.

Figure 11:
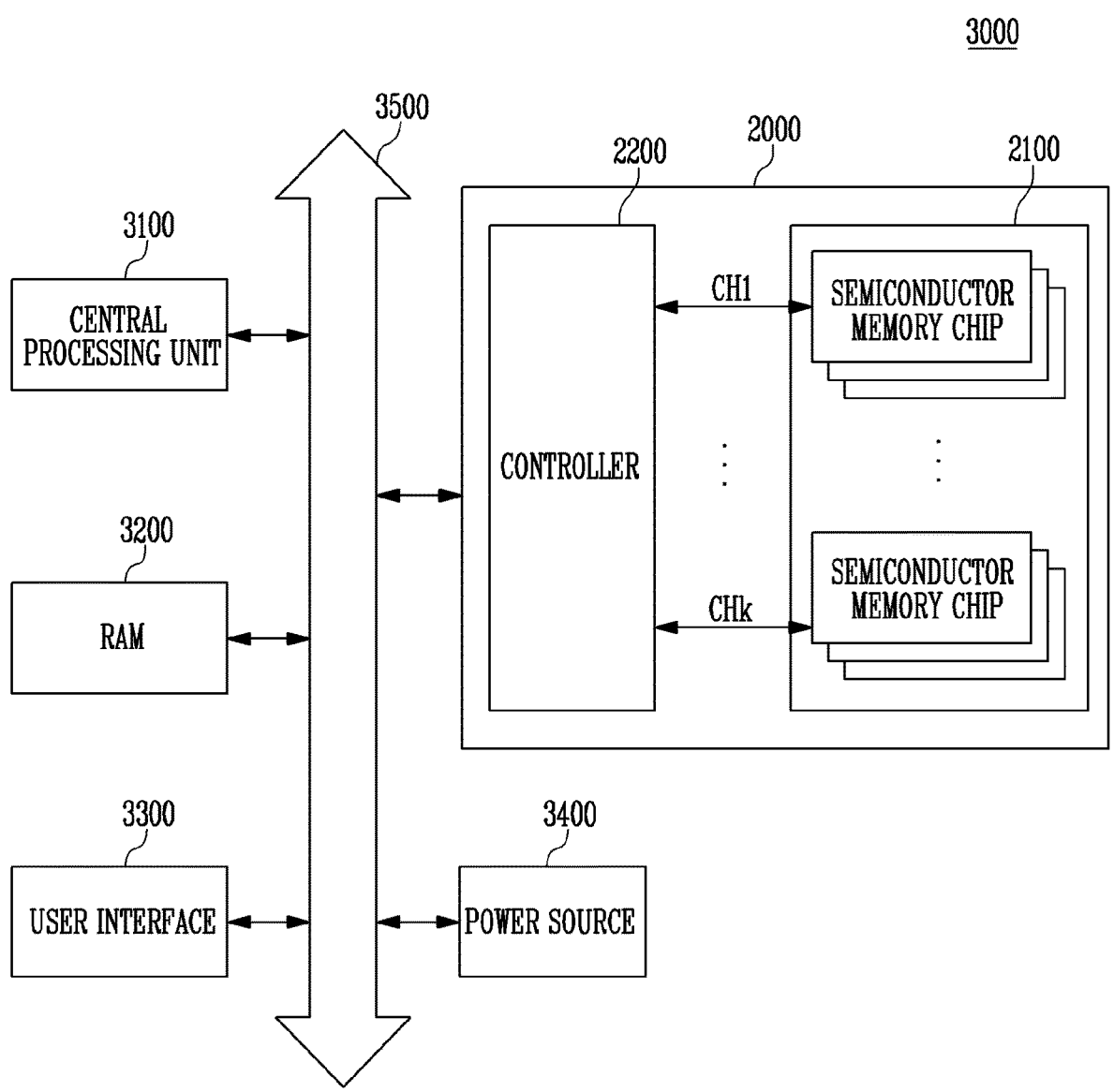
FIG. 11 is a block diagram illustrating a computing system including the memory system described with reference to FIG. 10.

FIG. 11 is a block diagram illustrating a computing system including the memory system described with reference to FIG. 10.

Referring to FIG. 11, the computing system 3000 may include a central processing unit 3100, a RAM 3200, a user interface 3300, a power source 3400, a system bus 3500, and a memory system 2000.

The memory system 2000 may be electrically coupled to the central processing unit 3100, the RAM 3200, the user interface 3300, and the power source 3400 through the system bus 3500. Data supplied through user interface 3300 or data processed by the central processing unit 3100 may be stored in the memory system 2000.

In FIG. 11, it is illustrated that the semiconductor memory device 2100 may be coupled to the system bus 3500 through the controller 2200 and channels CH1 to CHk. However, the semiconductor memory device 2100 may be directly coupled to the system bus 3500. In this case, the function of the controller 2200 may be performed by the central processing unit 3100 and the RAM 3200.

In FIG. 11, it is illustrated that the memory system 2000 described with reference to FIG. 10 is provided. However, the memory system 2000 may be replaced by the memory system 1000 described with reference to FIG. 9. In an embodiment, the computing system 3000 may be configured to include both the memory systems 1000 and 2000 described with reference to FIGS. 9 and 10.

According to embodiments of the present disclosure, in a program operation of the semiconductor device, a voltage applied to bit lines may be controlled according to a distance from the row decoder, so that the threshold voltage distribution of memory cells, which is typically widened due to word line loading, may be improved without decreasing program performance.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor memory device comprising:
   a memory cell array including a plurality of memory cells;
   a row decoder disposed at one side of the memory cell array; and
   a negative voltage switching circuit configured to receive and apply a plurality of negative voltages to bit lines of the memory cell array in a program operation, wherein the negative voltage switching circuit is further configured to:

apply a first negative voltage of the plurality of negative voltages to a first bit line of the bit lines coupled to a first set of memory cells of the plurality of memory cells disposed adjacent to the row decoder; and apply a second negative voltage of the plurality of negative voltages to a second bit line of the bit lines coupled to a second set of memory cells of the plurality of memory cells disposed more distant from the row decoder than the first set of memory cells, wherein the first negative voltage is more negative than the second negative voltage.

2. The semiconductor memory device of claim 1, further comprising:

an operation voltage generating circuit configured to generate a program voltage, a pass voltage, and a plurality of verify voltages for the program operation; and a read/write circuit coupled to the bit lines, the read/write circuit temporarily storing data to be programmed in the program operation and then controlling potential levels of the bit lines according to the temporarily stored data.

3. The semiconductor memory device of claim 2, wherein the read/write circuit includes a plurality of page buffers corresponding to the bit lines, and wherein each of the plurality of page buffers includes a latch configured to temporarily store data to be programmed in the program operation and store verify data corresponding to a verify result, based on a potential level of a corresponding bit line of the bit lines and the temporarily stored data in a program verify operation.

4. The semiconductor memory device of claim 3, wherein the plurality of page buffers generates and outputs latch signals according to the data stored in the latch or the verify data.

5. The semiconductor memory device of claim 4, wherein the negative voltage switching circuit is further configured to apply or interrupt the plurality of negative voltages to the bit lines in response to the latch signals.

6. The semiconductor memory device of claim 1, wherein the first set of memory cells coupled to word lines, respectively, each of the word lines having a first length based on a distance from the row decoder to a corresponding memory cell of the first set of memory cells; and wherein the second set of memory cells coupled to word lines, respectively, each of the word lines having a second length based on a distance from the row decoder to a corresponding memory cell of the second set of memory cells, the second length longer than the first length.

7. A semiconductor memory device comprising:

a memory cell array including a plurality of memory cells;

a voltage generating circuit configured to generate a program voltage, a pass voltage, a plurality of verify voltages, and a plurality of negative voltages for a program operation;

a row decoder configured to apply the program voltage, the pass voltage, and the plurality of verify voltages to word lines of the memory cell array;

a read/write circuit coupled to bit lines of the memory cell array, the read/write circuit temporarily storing data to be programmed in the program operation and then controlling potential levels of the bit lines according to the temporarily stored data; and a negative voltage switching circuit configured to apply the plurality of negative voltages to the bit lines in response to latch signals received from the read/write circuit, wherein the read/write circuit includes a plurality of page buffers corresponding to the bit lines, wherein each of the plurality of page buffers includes a latch configured to temporarily store data to be programmed in the program operation and store verify data corresponding to a verify result, based on a potential level of a corresponding bit line of the bit lines and the temporarily stored data in a program verify operation, and wherein the plurality of page buffers applies a program permission voltage or a program inhibition voltage to the bit lines according to the data stored in the latch or the verify data, and generates and outputs the latch signals corresponding to a node value of the latch.

8. The semiconductor memory device of claim 7, wherein the negative voltage switching circuit is further configured to:

apply a first negative voltage of the plurality of negative voltages to a first bit line of the bit lines coupled to a first set of memory cells of the plurality of memory cells disposed adjacent to the row decoder; and apply a second negative voltage of the plurality of negative voltages to a second bit line of the bit lines coupled to a second set of memory cells of the plurality of memory cells disposed more distant from the row decoder than the first set of memory cells, wherein the first negative voltage is more negative than the second negative voltage.

9. The semiconductor memory device of claim 7, wherein the bit lines are grouped into a plurality of bit line groups, and the negative voltage switching circuit is further configured to apply a different negative voltage among the plurality of negative voltages to each of the plurality of bit line groups.

10. A method for operating a semiconductor memory device, wherein the semiconductor memory device comprises a memory cell array including a plurality of memory cells, a row decoder disposed at one side of the memory cell array, and a plurality of word lines coupling the row decoder to the memory cell array; the method comprising:

applying a program permission voltage or a program inhibition voltage to a plurality of bit lines coupled to the memory cell array according to data to be programmed;

applying a plurality of negative voltages different from one another to selected bit lines of the plurality of bit lines to which the program permission voltage is applied;

applying a program voltage to a selected word line among the plurality of word lines;

performing a verify operation using only some verify voltages among a plurality of verify voltages, after the program voltage is applied; and interrupting one of the plurality of negative voltages applied to one of the selected bit lines, when a threshold voltage of at least one memory cell coupled to the one of the selected bit lines is higher than the some verify voltages as a result of the verify operation.

11. The method of claim 10, wherein, in the applying of the plurality of negative voltages to the selected bit lines, a first negative voltage of the plurality of negative voltages is applied to a first bit line of the selected bit lines coupled to a first set of memory cells of the plurality of memory cells disposed adjacent to the row decoder, and a second negative voltage of the plurality of negative voltages is applied to a second bit line of the selected bit lines coupled to a second set of memory cells of the plurality of memory cells disposed more distant from the row decoder than the first set of memory cells, wherein the first negative voltage is more negative than the second negative voltage.

12. The method of claim 10, wherein the plurality of bit lines are grouped into a plurality of bit line groups, and a different negative voltage among the plurality of negative voltages is applied to each of the plurality of bit line groups.

13. The method of claim 12, wherein a relatively higher negative voltage among the plurality of negative voltages is applied to each of the plurality of bit line groups as the bit line group is disposed more adjacent to the row decoder.

* * * * *